United States Patent [19]

Haubner et al.

[11] Patent Number: 4,630,043
[45] Date of Patent: Dec. 16, 1986

[54] VEHICLE DATA ACQUISTION AND DASHBOARD DISPLAY SYSTEM

[75] Inventors: Georg Haubner, Berg; Hans Petermann, Nüremberg; Hartmut Zöbl, Fürth, all of Fed. Rep. of Germany

[73] Assignee: Robert Bosch GmbH, Stuttgart, Fed. Rep. of Germany

[21] Appl. No.: 575,855

[22] Filed: Feb. 1, 1984

[30] Foreign Application Priority Data

Feb. 18, 1983 [DE] Fed. Rep. of Germany ....... 3305579

[51] Int. Cl.$^4$ .................. H04Q 9/14; G01D 3/10; G08B 19/00; G06F 15/20
[52] U.S. Cl. ........................... 340/825.57; 340/52 F; 364/424
[58] Field of Search ............ 340/52 F, 825.07, 825.57, 340/712; 370/92; 364/424, 426; 73/432 AD

[56] References Cited

U.S. PATENT DOCUMENTS

| | | | |
|---|---|---|---|
| 3,988,730 | 10/1976 | Valker | 340/52 F |
| 4,156,151 | 5/1979 | Borroni . | |
| 4,227,181 | 10/1980 | Brittain | 340/52 F |
| 4,344,136 | 8/1982 | Panik | 340/52 F |
| 4,371,934 | 2/1983 | Wahl et al. | 364/424 |
| 4,402,073 | 8/1983 | Hammond | 370/92 |
| 4,413,341 | 11/1983 | Markhasin et al. | 370/92 |
| 4,442,424 | 4/1984 | Shirasaki et al. | 340/52 F |
| 4,459,591 | 7/1984 | Haubner et al. | 340/825.57 |
| 4,464,933 | 8/1984 | Santis | 340/712 |
| 4,516,121 | 5/1985 | Moriyama et al. | 340/52 F |
| 4,551,801 | 11/1985 | Sokol | 340/52 F |
| 4,594,572 | 6/1986 | Haubner et al. | 340/52 F |

OTHER PUBLICATIONS

"μCs on a Chip and Integrated d/a's about to Usher in an IC Harvest", *Electronic Design* 01-04-1977.
Electronik Report-Jun. 1980 article by Mike Dance, entitled "Salplex ersetzt den Kabelbaum" or Salplex Replaces the Wiring Harness.
European Search Report-"Rercherchenbericht" of May 24, 1984.
Internationale Elektronische Rundschau, 12/75, D. Homburg, further to a report by Dillenburg and co-Workers in Bosch Technical Reports, 5/75.

*Primary Examiner*—Donald J. Yusko
*Attorney, Agent, or Firm*—Frishauf, Holtz, Goodman & Woodward

[57] ABSTRACT

A modular, space-saving vehicle data acquisition and dashboard display system, comprising analog and/or digital sensors (30, 31, 32) connected to a central control logic (14) which is in turn connected over a single digital data line to a plurality of control modules (26) including microprocessors (28) and connected to individual display elements (29) such as liquid-crystal displays. The system includes a travel data read-out (21) which can be interrogated using a keyboard (27).

15 Claims, 6 Drawing Figures

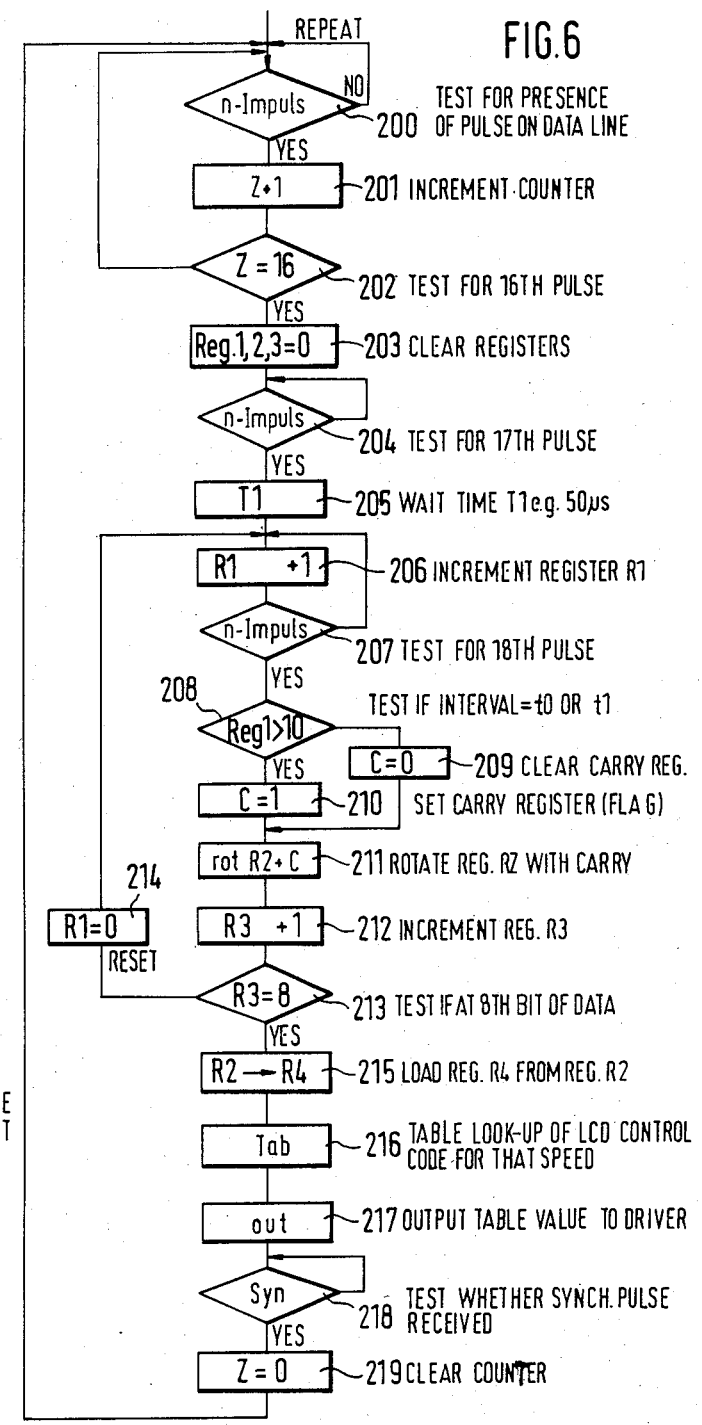

VEHICLE DATA ACQUISTION AND DASHBOARD DISPLAY SYSTEM

Cross reference to related applications, assigned to the assignee of the present application, the disclosures of which are hereby incorporated by reference:

U.S. Ser. No. 445,427, filed Nov. 30, 1982, Haubner et al; now U.S. Pat. No. 4,594,572, issued June 10, 1986;

U.S. Ser. No. 341,778, filed Jan. 22, 1982, Haubner et al, now U.S. Pat. No. 4,459,591, issued July 10, 1984.

The present invention relates generally to systems for displaying vehicle condition and performance information to the driver, and more particularly to a system for transmitting information from a plurality of sensors over a single data line to a plurality of digital display devices mounted in a dashboard.

BACKGROUND

In a conventional switching network of this kind, a ring counter sequentially polls various sensors which measure specified condition values in the motor vehicle and transmit these measurements as electrical values. The measured values are transmitted as electrical signals in a synchronized train through a logic network to various light-emitting diodes. Thus, the condition of the individual devices monitored by the sensors is optically displayed, as disclosed in German Patent Disclosure Document No. DE-OS 25 55 858, corresponding to U.S. Pat. No. 3,988,730. This solution has the disadvantage, above all, that a control line must be run for each light-emitting diode to the centrally disposed logic. Further, with this switching arrangement, the only condition values which can be handled are those which signal an ON or OFF condition. Continually varying condition values such as driving speed, fuel level, and the like, cannot be displayed with this switching arrangement. Also, in case of a defect in the switching network, the complete logic or the complete switching apparatus must be replaced.

THE INVENTION

It is an object to collect from digital and analog sensors in a central control logic as many motor vehicle condition values as possible, and to transmit them as serial digital signal trains with the highest possible data density over a control line to decentralized control modules with display devices connected to them.

Briefly, a number of sensors are connected to a central control logic, such as a microprocessor with built-in analog-to-digital converters. The control logic places on a common data line binary pulse trains representing both the display devices being addressed and the values to be displayed on each. Control modules, including read-only memory chips, select from the signal train on the common data line the signals intended for the devices controlled by them and translate them according to previously encoded tables into signals used by driver chips to drive display devices, such as liquid-crystal displays. By reducing to a single data line the connections required between the control logic and the dashboard, the invention conserves space, facilitates detection and replacement of defective components, and allows the same control logic hardware to be used on a variety of vehicles having their own respective read-only memories (ROM's) with only a software or programming change.

It is preferred to represent 0-signals and 1-signals as intervals of two different lengths between pulses and to represent the measured condition values in binary-coded-decimal form. For example, sixteen bits are used as an address, and eight bits are used as a value portion of each train.

DRAWINGS

FIG. 6 is a flow chart of the control module program for acquisition and processing of the rotary speed value.

DETAILED DESCRIPTION

Figure 1:
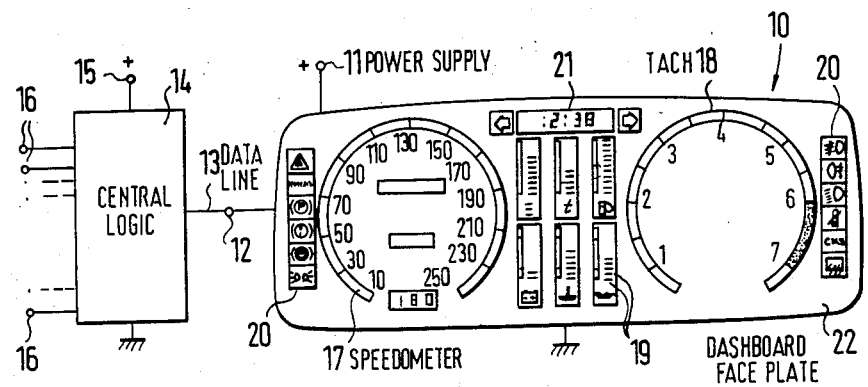
FIG. 1 is a schematic representation of a number of sensors connected to control logic, which is in turn connected over a single data line to a dashboard display of a motor vehicle.

FIG. 1 shows a dashboard display 10 which comprises multiple, replaceable display modules of liquid-crystal-display (LCD) display elements. The dashboard display 10 is connected on one side to ground and on the other side at a terminal 11 to a direct current(d-c) power supply. It is further connected at a terminal 12 to a data line 13 which originates at a central control logic 14. The control logic 14 is also connected to ground and at a terminal 15 with a d-c voltage supply. It has a plurality of inputs 16, to which are connected sensors, which measures the various motor vehicle condition values to be read from the dashboard display 10. The display modules of the dashboard display 10 include a speedometer 17, a tachometer 18, a monitoring display 19 for various measured quantities independent from each other, a condition display 20 for various lighting and signalling devices, as well as a travel data read-out 21 controlled by an on-board computer.

The various display modules are arranged behind a dash faceplate 22 of the dashboard 10, which has numerals and symbols printed thereon. The measurements taken by transducers of condition values are transmitted across the inputs 16 to the control logic 14. In the control logic 14, they are, as described in detail below, placed on the data line 13 in a clocked train of digital signals as binary-coded numbers. The measured values are loaded from there into the display modules corresponding to the condition quantities, processed and displayed on the corresponding LCD display elements of the dashboard 10.

Figure 2:
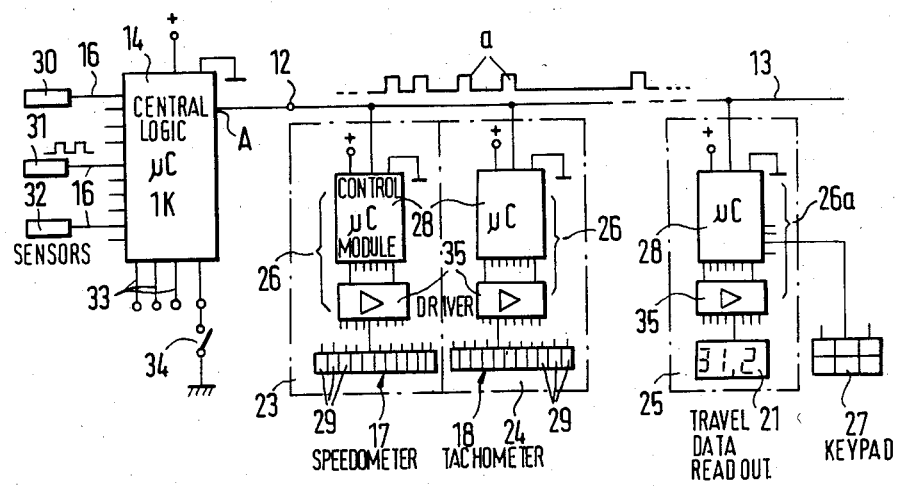
FIG. 2 is a block diagram of the wiring between the sensors, the central control logic, and the decentralized control modules, driver chips and display elements.

FIG. 2 is a block diagram of the circuit of the present invention. The speedometer 17, the tachometer 18 and the travel data display 21 are associated respectively with the display modules 23, 24 and 25. Further display modules (not shown) for the monitoring and condition displays 19, 20 are also connected to the data line 13. The display modules each contain a respective control module 26. The control module 26a for the travel data read-out 21 is a travel data computer, which is operated by means of a separately disposed keyboard 27. the control module 26a contains a microprocessor 28, whose outputs are connected through a driver stage 35 to the individual LCD display elements of the travel data read-out 21. In similar fashion, the remaining control modules 26 each comprise a microcomputer 28 whose outputs are connected through further driver stages 35 with their associated LCD display elements 29. The microcomputer 28 is preferably an Motorola 6805 microprocessor.

The central control logic 14 comprises a further microcomputer, preferably an INTEL 8748, with a one kilobit-EPROM (electrically programmable read-only memory). A "kilobit" here means 1,024 bits. A plurality of motor vehicle sensors is connected to the inputs of the microcomputer 14 and measures the condition values to be displayed. Three sensors 30, 31 and 32 are illustrated. The sensors 30, 31 and 32 transmit digital or analog electrical signals representing these measurements through the inputs 16 into the microcomputer 14. All the transmitters with analog measurements are connected to those inputs 16 which have A/D (analog-to-digital) converters built into the microcomputer 14. The microcomputer 14 is also provided with multiple programming inputs 33, through which selected programs and conversion tables can be loaded from read-only memory. The computer can, through its programming inputs 33, acquire data on the number of cylinders in the internal combustion engine, the speed ratio of the transmission stages and the sequence of the serially transmitted data to be displayed for various motor vehicle types. The constant data specific to the vehicle type can be loaded upon installation of the circuit in the vehicle. A test key can also use one of the programming inputs for calling up a testing program which checks the functioning of the microcomputer 14 and, in case of a defect, places a corresponding signal on the data line 13 or on a supplemental display.

Figure 3:
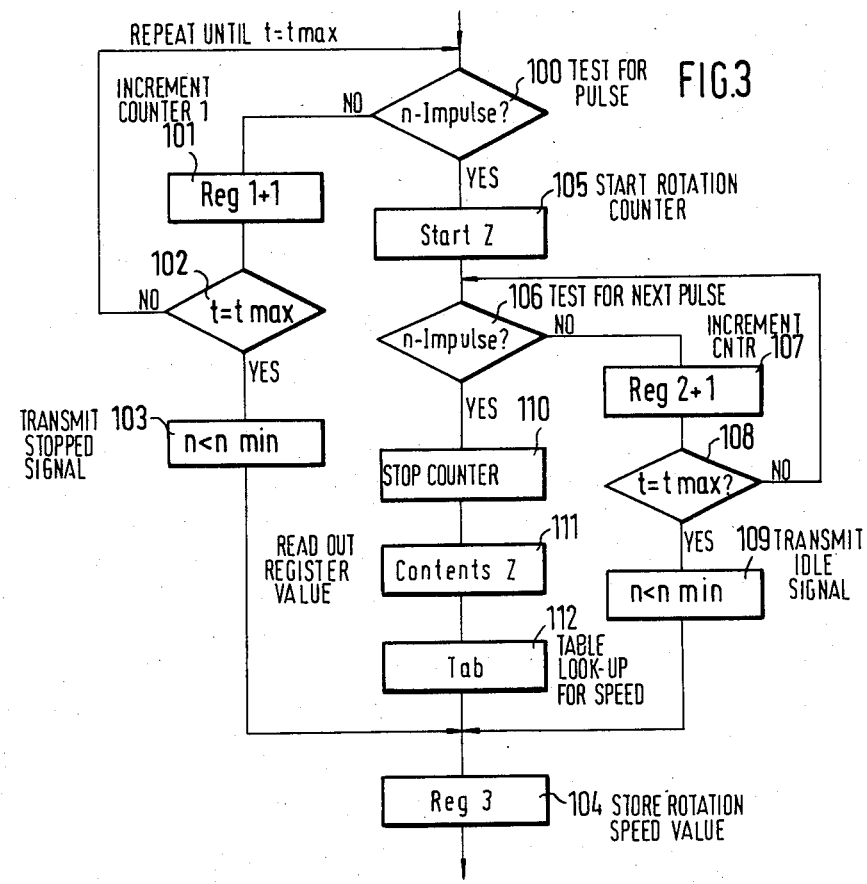
FIG. 3 is a flow chart of the program used by the central control logic for acquisition and display of motor speed data.

The flow chart of FIG. 3 sets forth the input and output through the various sensors 30, 31, 32 of the measured condition values used in calculating the motor rotation speed n. The flow chart shows the subroutine of the whole program of the microcomputer 14, which serves especially for measurement of the rotation speed.

In a first program step 100, the sensor 31 provided for the rotary speed n of the motor, which, for example, can be the ignition signal transducer for the ignition system of the internal combustion engine, is polled. The frequency of the pulses emitted by the sensor 31 varies in accordance with the motor rotation speed. If at program step 100 no rotary pulse is detected, a counting register 1 is incremented by 1 in the following program step 101. Next, program step 102 tests whether the value t in counting register 1 has reached a predetermined maximum value. If that is not the case, the program steps 100, 101 and 102 are repeated until this value is reached. Then, in program step 103, the rotary speed value zero is transmitted, which means that the motor is stopped. This zero value for rotary speed is stored in an output register 3 in a subsequent step 104. In the following program step, the next sensor can be polled. Conversely, when a pulse occurs at the rotary speed sensor 31 during program step 100, a rotation counter is started in program step 105. Program step 106 tests whether rotation sensor 31 has received a further pulse. If that is not the case, a counting register 2 is incremented by 1 in program step 107, and in step 108 the state of this counting register 2 is checked. Here also, the program loops through the steps 106, 107 and 108 and, upon reaching a predetermined count in the counting register 2, program step 108 transmits a minimum value 1, which indicates that the motor has not exceeded a desired idle rotation speed. Conversely, when a new rotation impulse occurs during the repeated running through the program loop 106, 107 and 108, the rotation counter is stopped in step 110. The state of the rotation counter is read out in step 111. It indicates how much time has elapsed between two successive rotation pulses. The counter condition is directly inversely proportional to the motor rotation speed n. In program step 112, after taking into account the number of cylinders loaded at a programming input 33, a table value corresponding to the rotation speed n determined is read out of the read-only memory. This table value is next stored in the output register 3 in the following step 104. In a similar manner, all the signals of the attached sensors are processed, and the table values determined are stored in corresponding output registers.

Figure 4:
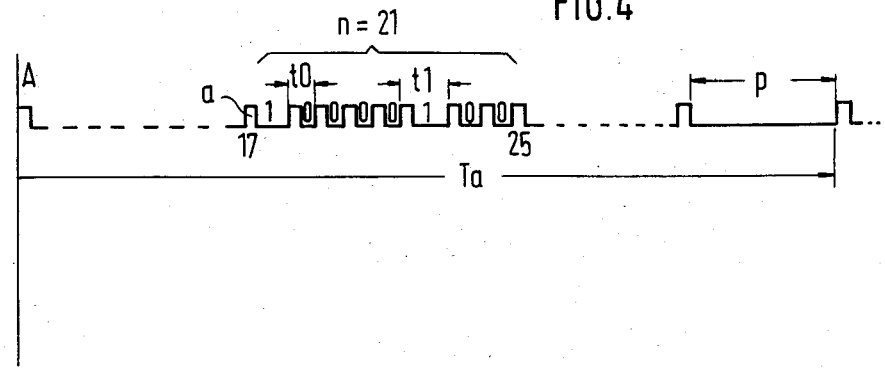
FIG. 4 illustrates the pulse train on the common data line.

In a later program segment (not shown), the count values stored in the output registers are placed on the data line 13 in a clocked signal train as binary-coded numbers. The sequence of these measurement data prepared in this manner by the mocrocomputer 14 is predetermined by a corresponding programming of the inputs 33. The signal train is thus placed at the output of the microcomputer 14 on the data line 13 as a train of electric impulses a, as shown in FIGS. 2 and 4. FIG. 4 illustrates a clocked signal train of binary-coded numbers appearing at the output A of the microcomputer 14. This example of a signal train comprises a pulse train Ta of 256 pulses a with a pulse width of 20 microseconds. At the end of thepulse train Ta occurs a synchronization pause p which resets all the control modules 26.

The values determined by the microprocessor 14 and stored in its output registers are placed on the data line 13 in binary-coded decimal form as a string of 0-signals and 1-signals which comprise intervals of different lengths between consecutive pulses a. The small interval has the value 0 and the large interval has the value 1. The time interval t0 between two pulses a which has the value 0 is 200 microseconds, and the time interval t1 with the value 1 is 400 microseconds. The pulse train Ta passes in 100 milliseconds, so that 10 pulse cycles occur in each second.

Figure 5:
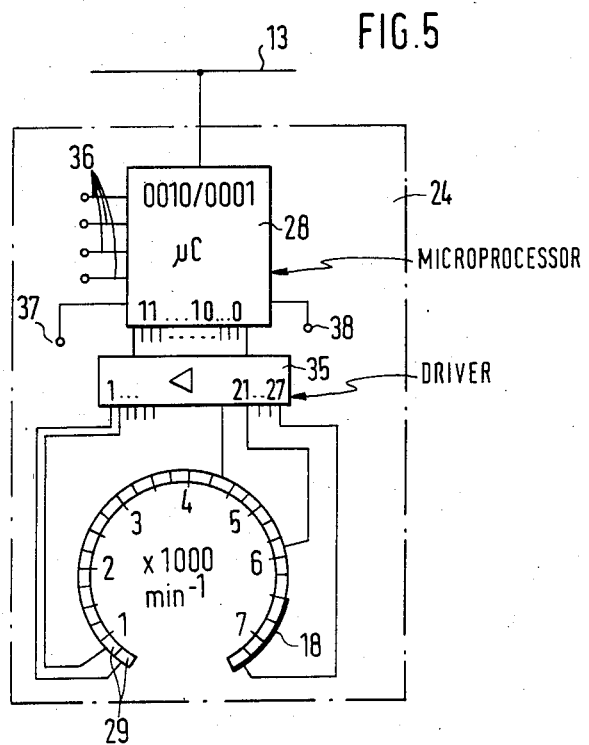
FIG. 5 shows a display module for the motor speed.

In the example shown, a motor rotation speed n of 200 revolutions per minute is measured by the sensor 31 and displayed on the rotation speed display 18. FIG. 5 shows the display module 24 provided therefor. The rotation speed display is formed as a circular scale and is divided into 27 liquid crystal display elements 29. In order to display the rotation speed 6000, the first 21 LCD display elements 29 must be turned on. This is accomplished by having the read-only memory of the central microprocessor 14 store the value 21 in binary-coded decimal form in the corresponding output register when the sensor 31 measures the rotation speed of 6000 rpm. In the example, the value 21 is placed on the data line 13 in binary-coded decimal form as corresponding pulse intervals between the 17th and 25th pulses. The microcomputer 28 of the display module 24 for the rotation speed display detects not only the pulses a but also the pulse intervals. During a timing loop in the program of the microcomputer 28, it is determined whether the current pulse interval has the value 0 or the value 1 or whether a synchronization pause p is present. The 0- and 1-signals are continually read into an 8-bit shift register of the microcomputer 28. Further, the pulses a are counted in a counting register of the microcomputer 28, which has been set to a specific number by pin programming of the microcomputer 28. Now that the central microcomputer has provided the rotation speed value 21 in binary-coded decimal on the data line 13 between the 17th and 25th pulses a, this value is stored with the 25 pulses a in the microcomputer 28. This stored value is decoded in the microcomputer 28 and, by means of corresponding conversion tables stored in its read-only memory, the microcomputer's outputs are activated. Thus, the outputs 1 through 21 produce a 1-signal, and the outputs 22 through 27 produce a 0-signal. The driver stage 35 connected downstream then activates the first 21 liquid-crystal-display elements 29 and thereby displays the motor rotation speed 6000 rpm. FIG. 6 illustrates a program with which the microcomputer 28 in FIG. 5 reads from the pulse train Ta the information directed to it concerning the motor rotation speed n. In the first program step 200, the microcomputer 28 tests whether a pulse a is present on the data line 13. As soon as such a pulse a occurs, the counting register is incremented by 1 in step 201. In the next program step 202, the counter state is checked. With the 16th pulse a, the counting register reaches the count of 16, and with the following program step 203 multiple registers R1, R2, R3 are cleared to 0, and thus prepared for reading in the desired rotation speed information. In the following step 204, the following 17th pulse is awaited. As soon as it occurs, a predetermined time T1 of, for example, 50 microseconds, passes in the following step 205. Then in the step 206, a register R1 is incremented from 0 to the number 1 and, finally, step 207 checks whether a further pulse a has occurred. If this is not yet the case, then the register R1 is incremented. This loop with the program steps 206 and 207 is repeated until the 18th pulse a occurs. By checking the count in register 1 of the number of passes, one can determine whether the pulse interval between two consecutive pulses a according to FIG. 4 is the time t0 or the time t1. At a clock time t0, which represents the information value 0, the register R1 has, for example, the contents 10. At a clock time t1, which represents the information value 1, the register R1 has by contrast been incremented to the value 30. The following program step 208 tests whether the content of register R1 is greater than 10. If this is not the case, a pulse interval t0 with the value 0 has been determined, and the carry register is cleared to 0 in program step 209. Conversely, if the content of the register R1 is greater than 10, a pulse interval t1 with the value 1 has been determined and the carry register is set to 1 in step 210. In the following program step 211, the register R2, together with the carry register, is rotated one step and thereby the first bit of the rotary speed information from the pulse train Ta is pushed into the first position of the register R2. In the following step 212, a further register R3 is incremented by 1. Step 213 checks whether the register R3 has been set to the value 8. As long as this is not the case, a further program step 214 resets the register R1 to 0, and the steps 206 and 207 are once again repeated until the next pulse a occurs.

In this manner, the information values between the 17th and 25th pulses a which are represented by the pulse intervals t0 and t1 of the pulse train Ta are determined and stored in register R2. With the 25th pulse a, the register R3 in program step 212 reaches the value 8. In the following step 215, the contents of the register R2 are transferred to a further register R4, and in step 216, the stored rotation speed information in register R4 is used to call up from a read-only memory table a value which is used in program step 217 to generate 0- and 1-signals at the 27 outputs of the microcomputer 28 for control of the corresponding display elements 29. In step 218, the synchronization pause p is awaited, and in step 219, the counting register is cleared to 0. Then the program recycles back to step 200, and the motor rotation speed is once again read from the following pulse train Ta into the display module 24. Since only 27 LCD display elements are needed for rotation speed display, the two leading bits of the binary-coded decimal number are free. They can thus be used, by means of appropriate programming of the central microcomputer 14 and the microcomputer 28 in the display module 24, for additional display values, such as the monitoring of particular headlights.

The microcomputer 28 is additionally provided with further inputs 36, on which values to be displayed can in certain cases be transmitted in parallel. In this case, one determines by a programming input 37 whether the serial data arriving on the data line 13 or the parallel data arriving over the inputs 36 are to be evaluated. It is also possible, supplemental to the serial data input over the data line 13, to connect particular signal transmitters directly over the inputs 36 to the microcomputer 28 and to process their signals together. Further, another programming input 38 of the microcomputer 28 can be used to actuate a test program.

The microcomputer 28 for the travel data display 28 must operate as a travel data computer and must be able, upon corresponding actuation of the keyboard 27, to calculate travel time, gasoline usage, average speed, and the like. Furthermore, it should display the time of day whenever no travel data are being called up. For determining the respectively desired travel data, it requires various values provided from the central microcomputer 14. In order to read these values out of the clocked signal train on the data line 13, multiple program segments similar to FIG. 6 must be run and the counting register must be correspondingly switched over so that it reads all of the values needed for calculation of the travel data and that the computer can process them with an internal program.

The invention is not restricted to the specific embodiment shown and described. It is clearly possible to code the data on the data line 13 as a train of 0- and 1-signals in simple binary code or in a 1-of-n code. The 0- or 1-signals can be transmitted as pulses a of different breadths, so that all pulse intervals with the exception of the synchronization pause p are equal. Finally, it is also possible to transmit the 0- or 1-signals as pulses a of different heights.

The essence of the invention is that the central control logic 14 places on the data line 13 a clocked signal train of binary-coded numbers which correspond to the values determined from the various sensors. It is also important that each control module contain a pulse counter and a decoder stage, which can be implemented using a microcomputer program similar to that shown in FIG. 6. The counter selects from the clocked signal train the binary-coded numbers associated with the control module by determining whether the first part of the signal train is the address of its module and, if so, allowing the decoding program segment to decode the remainder of the signal train, and the decoder translates these binary numbers into 0- or 1-signals. By means of these signals, the display elements 29 are controlled and display the value measured by the transducers or other sensors. In place of liquid-crystal-display elements 29 one can use light-emitting diodes, vacuum fluorescence displays, or other active, quasi-active or passive display elements. Generally, the data line 13 is a copper wire and the clocked signal train is transmitted by electrical pulses a. However, it is within the scope of the invention to make the data line 13 an optical fiber on which the data determined are transmitted in a clocked train of light impulses.

By the use of an intelligent control in the control modules, it is possible to perform the central control logic functions with a microcomputer of relatively small memory size. The subsequent processing of the data transmitted is accomplished in the intelligent control modules 26. In case of a defect, one can therefore replace individual modules with minimum repair effort. The configuration of the complete dashboard display 10 in individual control and display modules is selected in such a way that the costly components are separated from each other and from the remaining parts of the dashboard display. Under certain circumstances, it can be desirable to configure the costly display elements in such a manner that multiple display plates are connected to one and the same control module. Control modules and displays are connected in a separable manner and can be replaced separately from each other. To minimize the number of contacts which can come loose, it may be desirable to form each control module together with its associated display elements so that they form a replaceable display module.

In the embodment shown in FIG. 2, the circuit of the present invention includes an Intel 8748 microprocessor as the central control logic 14, and Motorola 6805 microprocessors as the control modules 26. The driver chips 35 are preferably model SM1804 K from the firm Siemens AG.

The manner in which the counter in each control module (26) selects out the signals addressed to that module is described in detail in U.S. Appl. Ser. No. 445,427 (30 Nov. 82)

The present invention permits separate testing and, if necessary, separate replacement of the central control logic and the decentralized control modules. A further advantage is that transmission of the binary coded numbers as a clocked signal train permits a high information density to be achieved. Inexpensive microprocessors with relatively small read-only memories can be used. The microcomputers can contain multiple alternative programs, from which the appropriate ones for the articular vehicle type can be selected at installation.

"Pin programming", as used above, means connecting pins or terminals of the integrated circuit together, in accordance with the manufacturer's specification sheets, with appropriate gates to make the integrated circuit respond to a particular signal or signals in the desired manner.

We claim:

1. A system for optical display of condition and performance information in a motor vehicle comprising
a plurality of sets of electro-optical display elements; (29);
a respective control module (26) connected to each set of display elements; (29)
a single central control logic (14); and
a single central data line (13) from said central control logic (14) to said respective control modules (26),
said central logic (14) being connected to sensors (30, 31, 32) for the condition and performance information and processing and transmitting the measured values of said information as clocked trains of serial digital signals a over said data line (13) through said control modules (26) to said display elements (29),
wherein said central logic (14) places on the data line (13) clocked trains of binary-coded numbers, represented by pulse intervals of varying lengths, which correspond to addresses of specific display control modules (26) and to the values measured by the sensors,
each control module (26) includes means for counting pulses and a decoding means,
said counting means including means responsive to an address portion of a pulse train, coded for its respective control module, for enabling said decoding means in said module, and
said decoding means translating a value portion of said binary-coded number into 0- and 1-signals for controlling individual display elements (29).

2. The system of claim 1, wherein said central control logic (14) for creation of said clocked signal train comprises a microprocessor with a read-only memory containing conversion tables for translating the values measured by the sensors (30, 31, 32) into said binary-coded numbers.

3. The system of claim 2, wherein each control module (26) comprises a microprocessor (28) with a read-only memory, which contains a conversion table for translating said binary-coded numbers selected from said clocked signal train into control signals for said display elements (29).

4. The system of claim 3, wherein said signal train is transmitted on the data line as a train of pulses which are coutned by counters in said control modules (26) and which
represent the binary-coded numbers by pulse intervals of differing lengths which symbolize 0- and 1-signals.

5. The system of claim 4, wherein the 0- and 1-signals represent the binary-coded numbers using a binary-coded decimal code.

6. The system of claim 4, wherein the counters of the control modules (26) can be cleared by a longer pause (p) between two signal trains.

7. The system of claim 5, wherein each replaceable control module (26) is detachably connected to at least one replaceable display containing display elements (29).

8. The system of claim 5, wherein each control module (26) with its associated display elements (29) is formed as a replaceable display module (23, 24, 25).

9. a method for acquiring, transmitting, and displaying information in a motor vehicle having a plurality of sensors (30, 31, 32) connected to a single central control logic and a plurality of display control modules (26) connected to said central logic by a single common digital data line (13), and display elements (29) connected to each control module (26),
comprising, in accordance with the invention, the steps of
(1) generating, in said single central control logic (14), and placing on said data line (13), clocked trains of digital signals, each train having an address portion and a value portion,
(2) distinguishing in each display control module (26) whether or not a train is addressed to the module, (3) evaluating in said module the value portion of each train addressed to the module, and (4) energizing selected display elements (29) associated with said module (26) in accordance with said evaluation.

10. The method of claim 9, further comprising the steps of sending analog information from analog sensors and digital information from digital sensors to said central logic, and converting said analog information at said central logic into digital information.

11. The method of claim 9, further comprising the step of converting the information from each sensor into the value portion of a respective signal train.

12. The method of claim 11, wherein said evaluating step includes translating said value portion into individual display element control signals.

13. The method of claim 9, further comprising representing 0-signals and 1-signals by time intervals of differing lengths between digital pulses.

14. The method of claim 13, further comprising coding information in said digital signals using a binary-coded decimal code.

15. The method of claim 13, further comprising the steps of separating signal trains by pauses longer than the interval between pulses, resetting and distinguishing means in each control module each time such a longer pause occurs.

* * * * *